United States Patent [19]

Fukuda et al.

[11] Patent Number: 4,477,730
[45] Date of Patent: Oct. 16, 1984

[54] LASER APPARATUS

[75] Inventors: Hirokazu Fukuda, Akashi; Koji Shinohara, Kobe; Yoshio Kawabata, Takasago; Yoshito Nishijima; Kosaku Yamamoto, both of Kobe, all of Japan

[73] Assignee: Fujitsu Limited, Kawasaki, Japan

[21] Appl. No.: 366,060

[22] Filed: Apr. 6, 1982

[30] Foreign Application Priority Data

Apr. 9, 1981 [JP] Japan ................................. 56-54706
Jan. 25, 1982 [JP] Japan ................................. 57-10556

[51] Int. Cl.³ ............................................. G01J 3/10
[52] U.S. Cl. .................................. 250/504 R; 250/347
[58] Field of Search .................... 250/504 R, 347, 339; 33/DIG. 21, 279; 356/72, 121, 123, 399, 251, 252

[56] References Cited

U.S. PATENT DOCUMENTS 4,192,995  3/1980  Anthon ........................... 250/347 X

FOREIGN PATENT DOCUMENTS 52-41113  10/1977  Japan .

OTHER PUBLICATIONS

Rieck, *Semiconductor Lasers*, 1970, pp. 61, 126–127.

*Primary Examiner*—Alfred E. Smith
*Assistant Examiner*—Jack I. Berman
*Attorney, Agent, or Firm*—Daniel Jay Tick

[57] ABSTRACT

A visible light emitting element is mounted adjacent a lead-chalcogenide infrared diode laser element on the same supporting member or heat sink adjacent. The optical axis of the laser apparatus is adjusted using a visible light beam emitted by the visible light emitting element. The light source is then changed from the visible light emitting element to the infrared diode laser element by shifting the laser mount.

8 Claims, 4 Drawing Figures

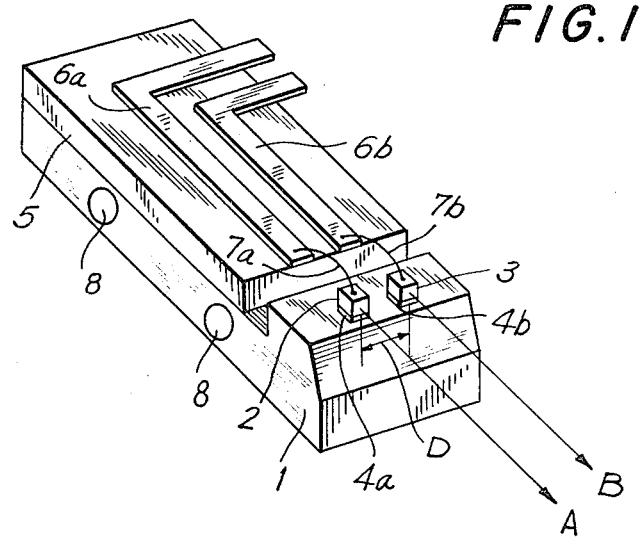
FIG. 1
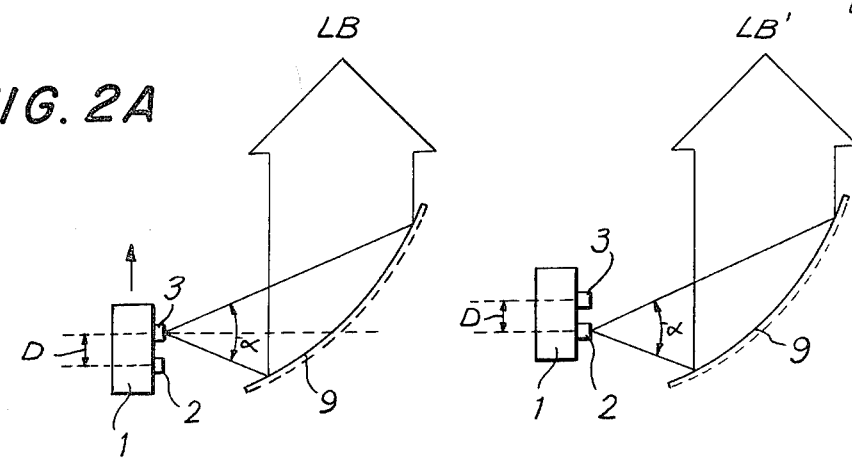
FIG. 2A
FIG. 2B

LASER APPARATUS

BACKGROUND OF THE INVENTION

The present invention relates to an improvement in semiconductor laser apparatus which radiates invisible light. More particularly, the invention relates to infrared diode laser apparatus with a simplified adjustment of its optical axis.

Recently, an atmospheric gas monitor system and gas leak monitor system utilizing an infrared beam were widely placed in practical use. These systems utilize the principle of infrared absorption spectrometry. Basically, an optical path for measurement is set between an infrared light source and an infrared light detector, and contamination or source gas leakage is defined by the amount of absorption of infrared light. However, a system for monitoring the gas condition along a path having a length of several hundred meters on a real time basis utilizing a laser as the infrared light source and setting an indoor optical path for measurement has a considerable problem in how to adjust the emitting axis of the invisible infrared laser to the optical axis of the detector.

It is well known at the present time to superimpose the visible laser beam with the infrared laser beam upon adjusting the optical axis of the infrared laser source in a long-path infrared gas detection system. This optical axis adjustment method such as, for example, as disclosed in the Japanese examined patent publication Toku-Ko-Sho No. 52-41113, involves the superimposing of the optical axis of the visible laser beam on the axis of the infrared laser beam. Thereafter, the optical axis of the system as a whole is adjusted, using the visible laser beam. However, the superimposing operation of the optical axis is very difficult in presently existing technology, because a He-Ne gas laser, independent of the infrared laser, is used as the visible laser source. Furthermore, another problem is that detection of superimposed axes requires great skill.

The principal object of the invention is to provide laser apparatus having an easier adjustment of the optical axes of the invisible laser operating in the infrared or ultraviolet region than in known apparatus.

An object of the invention is to provide laser apparatus having an optical system providing a simplified optical axis adjustment for a semiconductor laser element which is used as an infrared laser source, particularly in a long-path gas monitor system.

Another object of the invention is to provide laser apparatus which can easily re-adjust the optical axes for replacement or repair of laser elements.

BRIEF SUMMARY OF THE INVENTION

A visible light emitting element and an invisible semiconductor laser element having a light emitting surface in the same direction are mounted on a common supporting member adjacent each other in laser apparatus. In an optical axis adjusting device, a visible light emitting element is mounted on the common supporting member adjacent an invisible semiconductor laser element and the preadjusted relative position of the visible light emitting element and the light issuing collimator is replaced by the relative position of the invisible semiconductor laser element and the light issuing collimator system. More particularly, after the optical axis of the laser apparatus is adjusted using the visible light of the visible light emitting element, the light source position is replaced by moving the laser mount as much as the interval between the visible and invisible light emitting elements. The invisible laser axis may thus be aligned automatically.

BRIEF DESCRIPTION OF THE DRAWINGS

In order that the invention may be readily carried into effect, it will now be described with reference to the accompanying drawings, wherein:

FIG. 1 is a perspective view of an embodiment of the laser apparatus of the invention;

FIGS. 2A and 2B are schematic diagrams explaining the principle of the light axis adjustment of the laser apparatus of the invention.

DETAILED DESCRIPTION OF PREFERRED EMBODIMENTS

Figure 3:
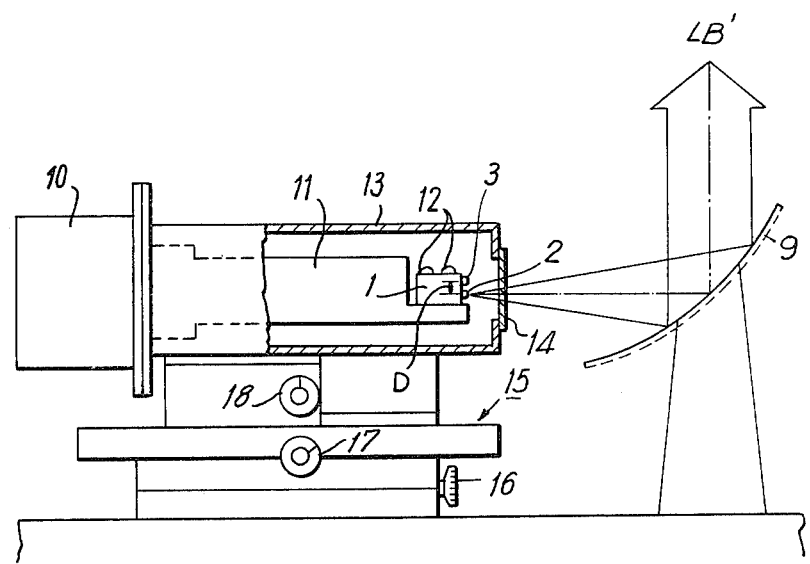
FIG. 3 is a side view, partly in section, of an embodiment of the laser apparatus of the invention.

FIG. 1 is a perspective view of an embodiment of the laser apparatus of the invention. In FIG. 1, an infrared semiconductor laser element 2 and a visible semiconductor laser element 3 are affixed, adjacent each other, to the top of a cooling stem 1 made of copper (Cu), which functions as a supporting member, via indium (In) layers 4a and 4b, respectively. In addition, a ceramic plate 5 is placed on the upper part of the cooling stem and coupling lines of terminal lead conductors 6a and 6b are provided thereon. The conductors 6a and 6b are connected to top contacts of the laser elements 2 and 3 via gold (Au) lines 7a and 7b, respectively. Furthermore, the cooling stem 1 is provided with the holes 8, through which the pertinent laser mount is attached to the cooling unit.

The infrared laser element 2 of FIG. 1 is the well known diode laser, about 200 $\mu$m $\times$ 200 $\mu$m $\times$ 200 $\mu$m. It is made of a lead-chalcogenide multi-element semiconductor such as, for example, PbSnTe or PbSSe, and is mounted so that the light emitting surface is in the direction of the arror A of FIG. 1. The visible laser element 3 is a red diode laser made of GaAlAs material and is mounted so that the light emitting surface is in the direction of the arrow B of FIG. 1, which is parallel to the direction of emission of the infrared beam. Since the visible diode laser element 3 is generally operated at room temperature, it is usually mounted on the cooling stem 1 via AuGe or AuSn. In the present invention, however, since the visible laser element 3 and the infrared diode laser element 2 are operated while cooled to a low temperature, such mounting structure is weak for the thermal cycle and is not practical. For this reason, in the invention, as in the infrared diode laser 2, the visible diode laser element 3 is bonded to the cooling stem 1 via a soft In layer 4 which is capable of absorbing thermal contractions.

In the aforedescribed semiconductor laser assembly, both semiconductor laser elements 2 and 3 emit light by being placed in an evacuated envelope and cooled up to 77° K. by liquid nitrogen and by having drive current supplied thereto via the lead conductors 6a and 6b.

Under such conditions, both semiconductor laser elements emit light. More particularly, the element 2 emits an invisible infrared laser beam having a wavelength of 4 to 20 $\mu$m, while the element 3 emits a visible laser beam having a wavelength of 7000 Å in parallel with the invisible beam. Therefore, the optical axis of the infrared beam emitted by the infrared laser element 2 is coarsely set, depending upon the visible beam emitted by the laser element 3, while the drive current to said infrared laser element is being cut. Thereafter, emission of the visible laser beam is suspended by a method such as terminating the supply of drive current to the visible laser element 3. At the same time, the infrared laser element 2 is operated and the optical axis of the infrared laser beam emitted by said laser element is adjusted precisely. The optical axis may thereby be adjusted simply and quickly, avoiding procedures for finding the path of the infrared laser beam in space.

A characteristic of a semiconductor diode laser is that the beam emitted by the laser element has a comparatively wide light emitting angle such as, for example, about 30°. It is thus essential that a collimator, which converges the emitted laser beam to a parallel beam, be utilized in the application of such laser beam. Since the invention utilizes a characteristic of such an optical system, a small deviation of emitting directions of infrared and visible laser elements is permissible. However, since the optical position for the optical system is an important factor in determining the accuracy of adjustment of the optical axis, the dimension D of the space between the two laser elements 2 and 3 must be first determined. The actual dimension D of such space may be set within a range of 500 to 1000 $\mu$m.

FIGS. 2A and 2B schematically illustrate the principle of optical axis adjustment of the invention. As shown in FIG. 2A, the relative position of the visible semiconductor laser 3 and a paraboloidal mirror 9 as the collimator is adjusted and the parallel laser beam LB reflected from said mirror is adjusted to the predetermined optical axis. Such adjustment of the optical axis is not difficult, because the laser beam LB is visible light. In fact, the diode laser of the GaAlAs family used has an optical output power of about 10 mW and the converged optical beam can transmit sufficiently in a long-path measuring system of approximately several hundred meters.

Thereafter, the relative positions shown in FIG. 2B are obtained by moving the cooling stem 1 a distance corresponding to the space D between the two laser elements 2 and 3 in the element arranging direction. This changes the light source of the paraboloidal mirror 9 from the visible laser element 3 to the infrared laser element 2 and said mirror directs an infrared laser beam LB' on the same optical axis. In this case, as hereinbefore explained, since the laser beam emitted by a semiconductor laser element has a comparatively wider emission angle, the infrared laser beam LB' may be obtained on the same optical axis, adjusted using the visible laser beam, as long as the paraboloidal mirror 9 is within the range of the emission angle $\alpha$ of the infrared laser element 2 replacing the visible laser element 3. Therefore, parallelism between the laser beam emitting directions A and B of the laser elements 2 and 3, respectively, is not a very serious problem.

The light emission collimator for obtaining a parallel beam may utilize a collimator lens, instead of the mirror 9. Furthermore, the optical axis may be aligned by shifting the paraboloidal mirror 9 or collimator lens, instead of replacing the light source by shifting the laser mount. More particularly, after the optical axis is adjusted by use of the visible laser beam, the collimator may be shifted in parallel as much as the space D between the two laser elements 2 and 3. The optical axis is thereby shifted in parallel as much as the space D for the infrared laser beam 2. However, in a long-path gas monitor system where the reciprocal optical path is set using a retro-reflector, it is preferable to utilize the system in which the laser mount is shifted, since this does not require readjustment of a retro-reflector and detector.

FIG. 3 shows the structure of the laser apparatus of the invention. In FIG. 3, a cooling rod 11 is coupled to a helium (He) refrigerator 10 and the cooling stem 1 is affixed to the head of said cooling rod, as hereinbefore explained, via screws 12. The cooling rod 11 is placed in a vacuum envelope 13 which provides a hermetically sealed ambient in order to obtain an adiabatic effect. A transparent window 14 for the infrared and visible beams is provided in the vacuum envelope 13 adjacent the semiconductor laser elements 2 and 3. $BaF_2$, $CaF_2$ or Irtran may be adequately utilized as the material for the window 14, which is transparent for both the infrared and visible beams.

The entire cooled semiconductor laser system is supported on a fine adjusting mechanism 15. The fine adjusting mechanism 15 includes an X axis adjusting dial 16 for the X stage, a Y axis adjusting dial 17 for the Y axis and a height adjusting dial 18 for the elevating stage. The embodiment of FIG. 3 includes infrared and visible laser elements 2 and 3, respectively, vertically spaced from each other by a distance or space D and requires only adjustment of the height adjusting micrometer dial 18 in order to set the optical axis of the infrared beam. More particularly, when the entire laser apparatus is elevated only a distance D, using the height adjusting micrometer 18, after the optical axis is adjusted via the visible laser element 3, the light source for the paraboloidal mirror 9 collimator is replaced by the infrared laser element 2 and the infrared laser beam LB' is emitted on the same optical axis.

As hereinbefore described, a pair of infrared and visible semiconductor laser elements are mounted. It is possible, however, to mount two or more infrared laser elements which provide the same or different oscillation wavelengths. In addition, the lead-chalcogenide infrared diode laser element may also be cooled to the operating temperature by being placed in a vacuum envelope having liquid nitrogen ($N_2$) or liquid helium (He) therein. In this case, the vacuum envelope is mounted on the fine adjusting mechanism 15 and the optical axis is adjusted as in the aforementioned case. A light emitting diode (LED) may be used as the visible laser beam emitting element, instead of a semiconductor laser element. The LED has a wider light emission angle, but offers a sufficiently focused visible light beam through a combination of light condensing systems.

As is apparent from the foregoing explanation, the present invention is essentially for mounting a visible light emitting element on a common supporting member adjacent an invisible infrared or ultraviolet semiconductor laser element and to set the optical axis of the infrared laser beam via the visible light beam.

Consequently, the apparatus of the invention has the advantages of greatly simplified adjustment reliability compared with existing methods of superimposing the optical axis. Knowing the distance or space between the visible and invisible laser elements easily and readily permits readjustment of the optical axis using the visible laser beam, even if the laser mount is replaced. As a result, the invention is very effective for the simplification of optical axis adjustment when utilized in a long-path gas detection system utilizing an infrared beam.

While the invention has been described by means of specific examples and in specific embodiments, we do not wish to be limited thereto, for obvious modifications will occur to those skilled in the art without departing from the spirit and scope of the invention.

We claim:

1. Laser apparatus having cooling means, a cooling stem supporting member coupled to said cooling means and an infrared laser element consisting of a lead-chalcogenide semiconductor mounted on said cooling stem and emitting an infrared beam, said laser apparatus comprising a visible light emitting semiconductor element mounted on said cooling stem spaced from said infrared laser element by a predetermined distance and emitting a visible light beam in parallel with and in the same direction as the infrared beam emitted by said infrared laser element.

2. Laser apparatus as claimed in claim 1, further comprising indium affixing said infrared laser element and said visible light emitting semiconductor element to said cooling stem.

3. Laser apparatus as claimed in claim 1, wherein said cooling means comprises a refrigerator unit having a cooling rod coupled thereto and said cooling stem is affixed to the free end of said cooling rod, and a vacuum envelope surrounding said free end of said cooling rod and said cooling stem.

4. Laser apparatus as claimed in claim 3, wherein the vacuum envelope of said cooling means has a light transmitting window adjacent said infrared laser element and said visible light emitting semiconductor element permitting the infrared beam emitted by said infrared laser element and the visible light beam emitted by said visible light emitting semiconductor element to pass.

5. Laser apparatus, comprising a supporting member;

an invisible laser semiconductor element mounted on said supporting member and emitting an invisible laser beam;

a light emitting optical system for converting the invisible laser beam emitted by said invisible semiconductor laser element into a parallel beam;

a visible light emitting element mounted on said supporting member adjacent said invisible semiconductor laser element in spaced relation with said invisible semiconductor laser element; and position adjusting means coupled to at least one of said supporting member and said light emitting optical system for replacing the predetermined relative position between said visible light emitting element and said light emitting optical system with the relative position between said invisible semiconductor laser element and said light emitting optical system.

6. Laser apparatus as claimed in claim 5, wherein said position adjusting means comprises a position adjusting micrometer for aligning said invisible semiconductor laser element with the position of said visible light emitting element preadjusted for said light emitting optical system by shifting said supporting member as much as the distance between said invisible semiconductor laser element and said visible light emitting element.

7. Laser apparatus as claimed in claim 5, further comprising a cooling system having cooling means, a vacuum envelope and a cooling stem coupled to said cooling means and having a free end in said vacuum envelope, said cooling stem functioning as said supporting member, and wherein said invisible semiconductor laser element comprises a lead-chalcogenide infrared laser mounted on said cooling stem at said free end thereof in said vacuum envelope, and said visible light emitting element being mounted on said cooling stem adjacent said invisible semiconductor laser element whereby said invisible semiconductor laser element and said visible light emitting element are coolable to a low temperature by said cooling system.

8. Laser apparatus as claimed in claim 5, wherein said visible light emitting element consists of a visible semiconductor laser element.

* * * * *